United States Patent [19]

Rancourt et al.

[11] 4,293,732
[45] Oct. 6, 1981

[54] SILICON SOLAR CELL AND 350 NANOMETER CUT-ON FILTER FOR USE THEREIN

[75] Inventors: James D. Rancourt; Richard I. Seddon, both of Santa Rosa, Calif.

[73] Assignee: Optical Coating Laboratory, Inc., Santa Rosa, Calif.

[21] Appl. No.: 51,379

[22] Filed: Jun. 25, 1979

Related U.S. Application Data

[63] Continuation of Ser. No. 945,433, Sep. 25, 1978, abandoned, which is a continuation of Ser. No. 823,843, Aug. 11, 1977, abandoned.

[51] Int. Cl.³ ............................................ H01L 31/06
[52] U.S. Cl. ................................... 136/257; 136/256; 350/290; 350/292; 350/311
[58] Field of Search ............. 136/89 CL, 89 CC, 256, 136/257; 250/226; 350/288, 290, 292, 311

[56] References Cited

U.S. PATENT DOCUMENTS 3,076,861 2/1963 Samulon et al. ...................... 136/89
3,996,461 12/1976 Sulzbach et al. ................. 250/211 J Primary Examiner—Aaron Weisstuch
Attorney, Agent, or Firm—Flehr, Hohbach, Test, Albritton & Herbert

[57] ABSTRACT

Solar cell construction having a body formed essentially of silicon and having a surface with a photovoltaic junction applied thereon. An anti-reflection coating is formed on the surface. A transparent protective cover is provided. A cut-on filter is carried by the cover for reflecting solar energy below approximately 350 nanometers. A layer of substantially transparent cement is used for securing the protective cover to the body so that it overlies the junction and the anti-reflection coating. The cut-on filter includes a stack of high and low index layers for reflecting solar energy in the ultra-violet region of 350 nanometers and below and also may include at least one additional layer of material of absorbing ultraviolet energy below 350 nanometers which passes through the high and low index layers above it.

18 Claims, 5 Drawing Figures

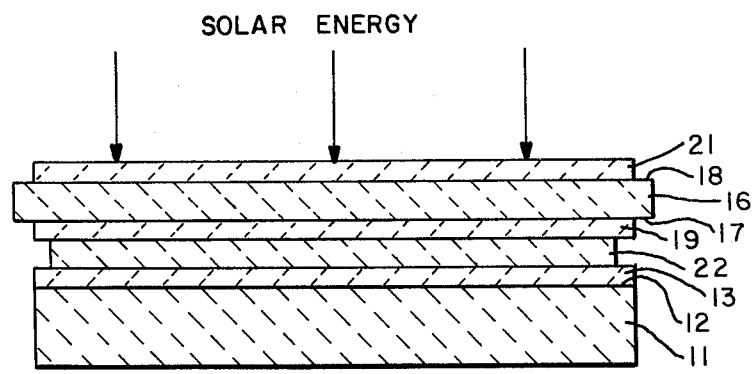
FIG.—1
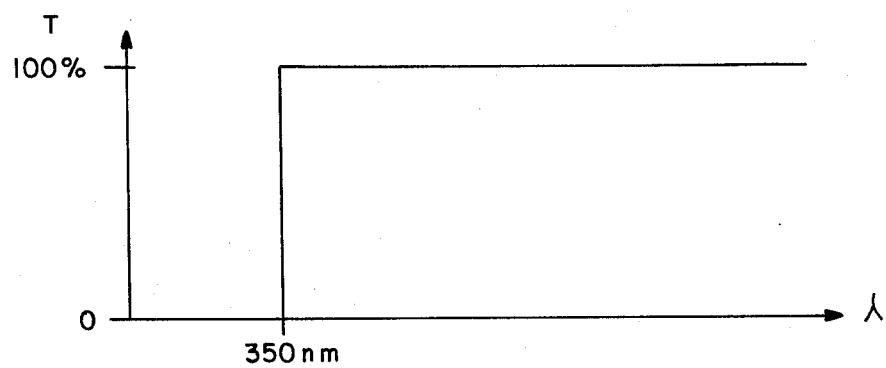
FIG.—2
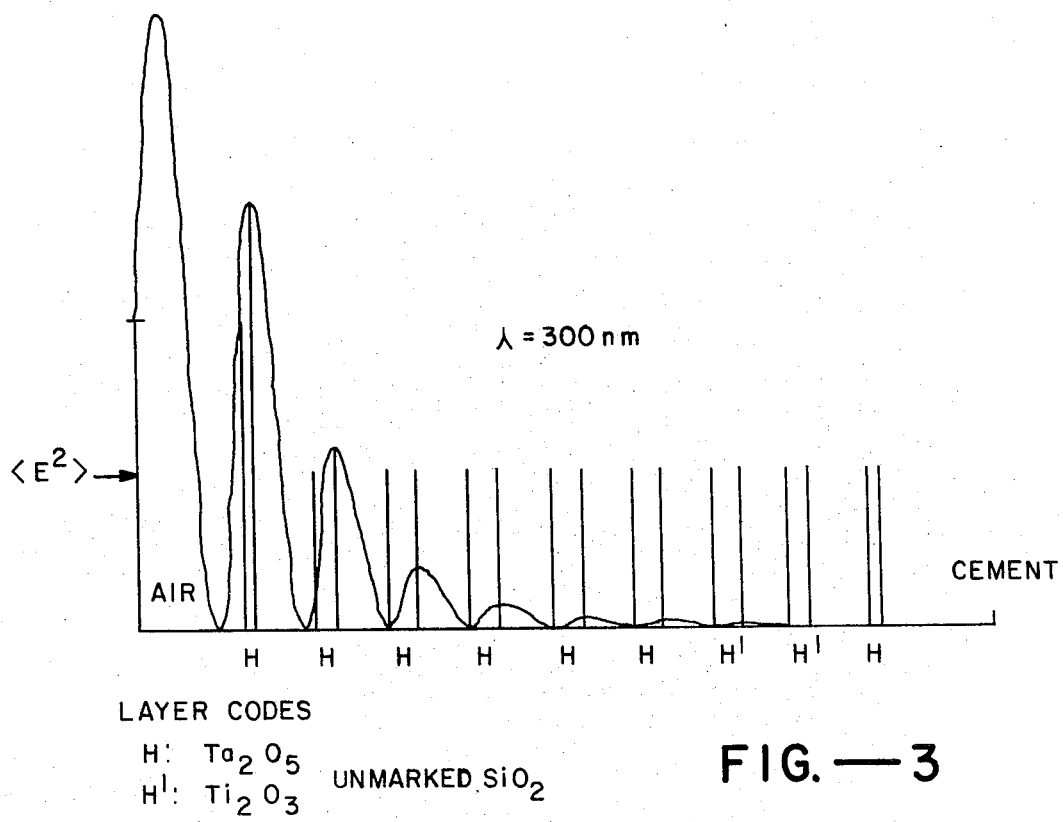
FIG.—3

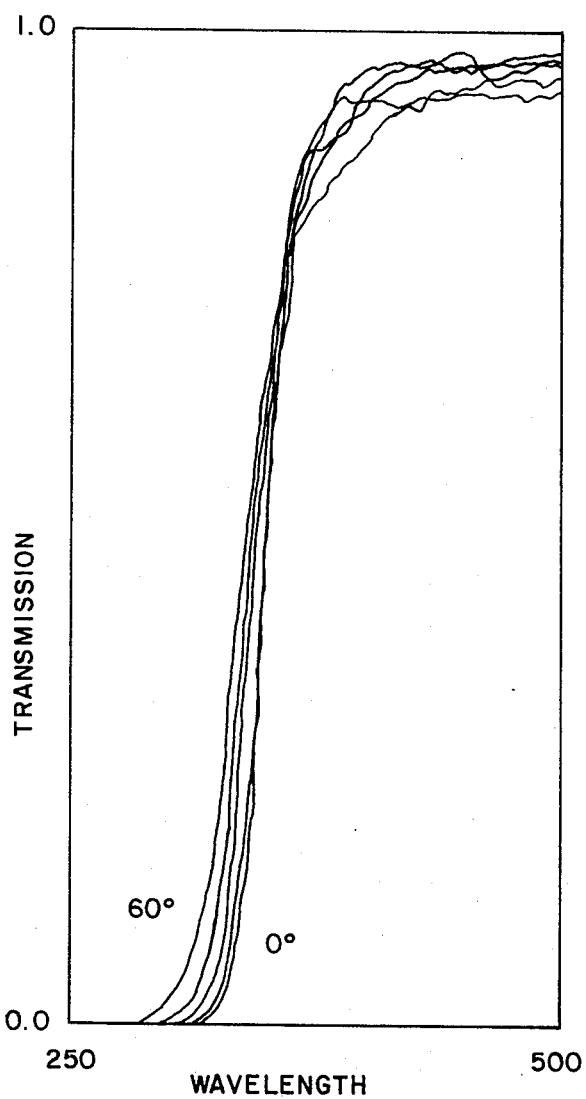
FIG.—4
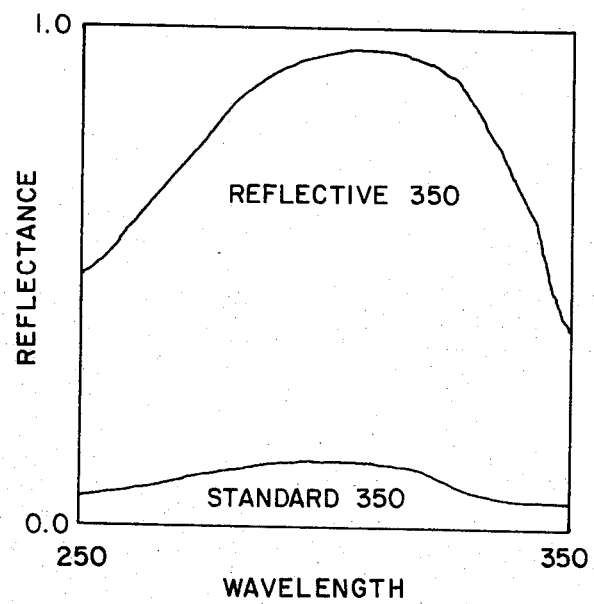
FIG.—5

SILICON SOLAR CELL AND 350 NANOMETER CUT-ON FILTER FOR USE THEREIN

This is a continuation of application Ser. No. 945,433 filed Sept. 25, 1978, abandoned which was a continuation of application Ser. No. 823,843, filed Aug. 11, 1977, abandoned.

BACKGROUND OF THE INVENTION

Silicon solar cells have been utilized for some time in space satellites and in such applications are covered with a thin glass or fused silica sheet ranging in thickness from 150 to 1,000 micrometers or 6 to 60 mils in thickness. The cover is utilized to protect the silicon solar cell from charged particles, e.g. protons and electrons as might be found in the Van Allen belts and to increase the emissivity of the cell so that it radiates more heat and thereby reducing the cell temperature and improving its efficiency of conversion of light to electricity. Such covers have been cemented to the cell with an adhesive which is degraded by exposure to ultraviolet light. To prevent such degradation in the past, a thin film filter has been placed on the cover to block the harmful ultraviolet rays. Alternately, blockage has been accomplished by utilizing a glass cover which does not transmit in this portion of the spectrum. The disadvantage of such an approach is that although the ultraviolet light is prevented from reaching the cement, the ultraviolet energy is absorbed. This absorption raises the temperature of the silicon solar cell and thereby reduces its efficiency because the absorbed ultraviolet light is converted into heat. There is therefore a need for a new and improved solar cell construction which will overcome this disadvantage.

SUMMARY OF THE INVENTION AND OBJECTS

The solar cell construction comprises a body formed essentially of silicon and having a surface with a photovoltaic junction applied thereon. An anti-reflection coating is formed on the surface. A transparent protective cover is provided. A cut-on filter is carried on the underside of the cover for reflecting ultraviolet energy in the region of 350 nanometers and below. A layer of substantially transparent cement is provided for securing the protective cover to the body so that it overlies the junction and the anti-reflection coating. An additional anti-reflection coating is carried by the upper surface of the protective cover. The cut-on filter comprises a stack of high and low index layers for reflecting solar energy in the ultraviolet region of 350 nanometers and below. It also includes a layer of light absorbing material which overlies the cement and for absorbing any light energy below the region of 350 nanometers which passes through the stack of high and low index layers so that a minimum amount of energy in the region of 350 nanometers and below will reach the adhesive.

In general, it is an object of the present invention to provide a solar cell construction in which a substantial portion of the ultraviolet energy below 350 nanometers is reflected.

Another object of the invention is to provide a solar cell construction of the above character which absorbs less ultraviolet light and which has increased efficiency.

Another object of the invention is to provide a solar cell construction which is relatively insensitive to the angle of incidence of the solar radiation on the solar cell.

Another object of the invention is to provide a solar cell construction of the above character which is provided with at least one absorbent layer to absorb any ultraviolet light which may attempt to pass through the cut-off filter because of an angle of incidence different from normal.

Another object of the invention is to provide a solar cell construction of the above character in which the efficiency is improved by approximately four percent.

Additional objects and features of the invention will appear from the following description in which the preferred embodiments are set forth in detail in conjunction with the accompanying drawing.

BRIEF DESCRIPTION OF THE DRAWING

FIG. 1 is a cross-sectional view of a typical solar cell construction incorporating the present invention.

FIG. 2 is a curve showing the transmittance of the anti-reflection coating utilizing the solar cell.

FIG. 3 is a graph showing the $<E^2>$ calculation for the reflective 350 nanometers cut-on solar cell cover incorporating the present invention.

FIG. 4 is a graph showing the major cut-on shift of the reflective solar cell cover incorporating the present invention at angle of incidence of 0°, 15°, 30°, 45° and 60°.

FIG. 5 is a graph showing the major reflectance of a standard 350 nanometer cut-on solar cell cover as compared to a solar cell cover incorporating the present invention.

DESCRIPTION OF THE PREFERRED EMBODIMENTS

A cross-sectional view of a silicon solar cell construction incorporating the present invention is shown in FIG. 1. As shown therein, it consists of a body 11 formed essentially of silicon having an index of refraction of approximately 3.5 to 4 and which is provided with a generally planar surface 12 that has a photovoltaic junction (not shown) formed thereon in a conventional manner. After the silicon solar cell has been fabricated, an anti-reflection coating 13 is formed thereon. This anti-reflection coating 13 can be of a conventional single layer type or alternatively can be a two layer antireflection coating of the type described in copending application Ser. No. 650,258 filed on Jan. 19, 1976 now U.S. Pat. No. 4,055,442.

A solar cell cover 16 is provided and is formed of a conventional ultraviolet transparent thin glass or fused silica sheet having a thickness of from 150 to 1,000 micrometers or from 6 to 60 mils and with an index of refraction of approximately 1.45 to 1.52. The cover 16 is provided with first and second planar parallel surfaces 17 and 18. A cut-on filter 19 of the present invention is provided on the first surface 17 and an anti-reflection coating 21 is provided in the second surface of the cover 16. The cut-on filter is provided for reflecting light energy in the ultra violet region between approximately 350 to 250 nanometers. A conventional adhesive or cement layer 22 is provided for securing the cover 16 with its first surface 17 with the cut-on filter 19 formed thereon facing the photovoltaic junction and for cementing the cover to the cell 11. The cement which is used for the layer 22 is substantially transparent and typically has an index of refraction of approximately 1.43 to 1.5. Thus it can be seen that the anti-reflection coating 13 is provided for matching the silicon body 11 which has an index of approximately 4 into the cement which has an index of approximately 1.4. The anti-reflection coating is formed of first and second layers with the first layer being formed of a material having a high index of refraction which is less than that of silicon, ranging from 2.35 to 2.4 and being closer to the silicon body than the second layer. The second layer is formed of a material having a low index of refraction which is greater than that of cement but less than that of the first layer, ranging from 1.6 to 1.7 as explained in said application Ser. No. 650,258 filed on Jan. 19, 1976.

Anti-reflection coating 21 is of a conventional type and can consist of a single layer quarter wave of a low index material such as magnesium fluoride or alternatively an anti-reflection coating of the type disclosed in U.S. Pat. No. 3,185,020. The anti-reflection coating 21 is used to match the index of refraction of the fused silica cover 16 and to that of the incident medium, which in outer space, may be a vacuum.

The cut-on filter 19 of the present invention has a high reflectance (non-absorbing) band in the ultraviolet region that is from approximately 350 nanometers and below. The long wavelength edge of this band is substantially angle insensitive. This is achieved by the use of a slightly modified quarter wave stack which is essentially non-absorbing at wavelengths longer than 250 nanometers and shorter than 1200 nanometers. The stack consists of a plurality of layers with alternate layers being formed of a material having a low index of refraction ranging from 1.4 to 1.7 and the remaining layers being formed of a material having a high index of refraction ranging from 2.00 to 2.4. For the low index material it has been found particularly desirable to utilize a fused silica having an index of refraction of 1.4686 and for the high index material to utilize tantalum pentoxide having an index of refraction of 2.23. It has been found that zirconium oxide can be utilized in place of tantalum pentoxide but it is less desirable than tantalum pentoxide because the lower index ratio means that the edge shift (hereinafter described) is more severe resulting in somewhat more absorption at an angle from normal as well as a need for a larger number of layers in a stack to achieve a given reflectance value. Another material which can be used for the non-absorbing high index material is hafnium oxide. Other materials which can be used for the non-absorbing low index material are silicon dioxide, silicon sesquioxide, magnesium fluoride and sapphire.

In the design of the quarter wave stack for the cut-on filter, the design wavelength of the center of the stack is selected such that the edge of the high reflection band is located at 350 nanometers to provide the desired high reflectance. It is possible to utilize only a single pair of high and low index layers for the filter although it is desirable to utilize a plurality of pairs.

When tantalum pentoxide is utilized, it has been found that it absorbs in the region of approximately 200 to 275 nanometers. However, there is a wavelength shift when the angle of incidence of the solar energy is substantially changed from normal or perpendicular to the surface which causes the edge of the cut-on filter to shift to a shorter wavelength or away from the 350 nanometers region as for example down to 325 nanometers. This in effect causes a window to be formed through which ultraviolet radiation can leak and pass through the cut-on filter unless additional means is provided as a part of the cut-on filter to absorb any ultraviolet energy which possibly can leak through the stack of high and low index layers. To eliminate the shift in the cut-on wave length with angle, at least one and preferably a few of the high index layers of the quarter-wave stack on the side of the stack away from the incident light are changed from the high index material to a material which is capable of blocking or in other words absorbing ultraviolet energy such as titanium oxide. Other material which can be utilized for this purpose are titanium dioxide, cerium oxide and zinc sulphide. The effect of this substitution is to cause the energy below approximately 350 nanometers that is transmitted by a tilted cut-on filter to be absorbed in this layer thus permitting the energy from reaching the cement and degrading the same. Although this will cause some heating, this heating is far less than that encountered by a conventional design which utilizes only titanium oxide as the high index layer. In particular, it should be appreciated that generally solar panels are oriented so that the sunlight is incident normally on the cells rather than at an angle. When such is the case, very little ultraviolet light will penetrate through the cut-on filter and be absorbed by the titanium oxide layers and therefore the heating effect will be minimal.

A typical design incorporating the present invention is set forth below consisting of seventeen layers counting from the substrate.

| Layer | Material | Refractive Index | Design Thickness (nm) |
|---|---|---|---|
| 1 | Tantalum Pentoxide | 2.2300 | 95.9 |
| 2 | Fused Silica | 1.4686 | 336.2 |
| 3 | Titanium Dioxide | 2.5600 | 198.1 |
| 4 | Fused Silica | 1.4686 | 265.0 |
| 5 | Titanium Dioxide | 2.5600 | 265.0 |
| 6 | Fused Silica | 1.4686 | 276.0 |
| 7 | Tantalum Pentoxide | 2.2300 | 285.0 |
| 8 | Fused Silica | 1.4686 | 284.0 |
| 9 | Tantalum Pentoxide | 2.2300 | 284.0 |
| 10 | Fused Silica | 1.4686 | 284.0 |
| 11 | Tantalum Pentoxide | 2.2300 | 284.0 |
| 12 | Fused Silica | 2.4687 | 284.0 |
| 13 | Tantalum Pentoxide | 2.2300 | 284.0 |
| 14 | Fused Silica | 1.4686 | 284.0 |
| 15 | Tantalum Pentoxide | 2.2300 | 190.4 |
| 16 | Fused Silica | 1.4686 | 336.0 |
| 17 | Tantalum Pentoxide | 2.2300 | 95.0 |

From the above it can be seen that the stack begins with a high index layer and ends with a high index layer and that a number of pairs of high and low index layers are provided. Any number of pairs can be provided depending upon the desired result. The tantalum pentoxide/fused silica quarter wave stack is centered near 284 nanometers and has a reflection band that starts at 350 nanometers on long wavelength side and extends to the absorption edge of $Ta_2O_5$ that occurs at approximately 275 nanometers. Absorption causes a rapid fall-off in the reflectance beyond 275 nanometers. Layers 3 and 5 are the ultraviolet absorbing layers. It should be appreciated that some variations to the typical design set forth above can be readily made with the exact values to be based upon trade offs between the index of refraction of the cover, the cost of materials and the amount of reflection desired.

When zirconium dioxide and fused silica are used to construct the ultraviolet high reflectors, two stacks are required to prevent short wavelength leaks since the absorption edge of zirconium dioxide is at too short a wavelength to preclude leaks by absorbing light.

FIG. 3 is the plot showing the electric field entering the stack. The layer codes are:
H=Ta$_2$O$_5$
H$^1$=Ti$_2$O$_3$
Unmarked-SiO$_2$ The plot shows the strength of the light as a function of the depth in the filter. As can be seen as the light penetrates into the layers of the stack, its strength is decreased. By the time that the titanium oxide layers H$^1$ are reached, the strength of the light has been reduced to almost zero so that there is no ultraviolet light to be absorbed by the titanium oxide layers which are the third and fifth layers counting from the substrate.

If the filter should happen to be tilted, then the light is no longer normally incident thereto and the edge will shift from 350 nanometers to shorter wavelengths to provide a small window. Any ultraviolet passing through this small window however will be absorbed by the third and fifth titanium oxide layers. These layers are back-up layers to prevent ultraviolet light from reaching the cement and degrading the same. The titanium oxide is a good material for this purpose because it is not angle sensitive and because intrinsically it absorbs ultraviolet wavelengths below 350 nanometers.

It should be appreciated that if desired, additional layers of titanium oxide can be added to obtain better blocking. However, the addition of more layers adds to the expense of the cut-on filter.

In FIG. 4 there is shown the cut-on shift of a filter incorporating the present invention. The angles of incidence are 0°, 15°, 30°, 45° and 60° as shown. The curves shown in FIG. 4 show that the angle shift is not very great.

In FIG. 5 there is shown a comparison between the measured reflectance of a standard 350 nanometer cut-on solar cell cover as compared to a solar cell cover incorporating the present invention which is identified as reflective 350. As can be seen from the curves, there is a great improvement in reflectivity. Any difference between 100% and the effective curve represents absorption. As can be seen, the reflective 350 solar cell cover absorbs much less ultraviolet energy than does the standard 350 nanometer cut-on solar cell cover. The reflectance of the 350 nanometer cut-on solar cell cover must be weighted against the curve of the solar energy in this region.

By providing such reflective 350 nanometer cut-on solar cell cover, approximately 4% and certainly over 3% of the total solar energy incident upon the solar cell is reflected in addition to that which is reflected by a conventional solar cell cover so that the total energy reflected is in the vicinity of 90%. By providing the reflective 350 nanometer cut-on solar cell cover and its consequent 4% increase in reflection of the total energy, 4% less heat is absorbed by the solar cell with a consequent increase in efficiency of the solar cell up to approximately 2%.

When a solar cell is operating in space, it is believed that the temperature reduction will be approximately 4° C. In general, the performance of a solar cell changes by ½% per degree to give the approximately 2% more solar cell output.

It should be appreciated that the coating of the present invention can be also utilized in conjunction with absorbing glass covers which are used to block the ultraviolet. In such a case, the quarter wave stack is applied to the outer surface of the glass cover, thus reducing the absorption of ultraviolet energy by the cover. In the case of the ultraviolet transparent covers, such as fused silica, these coatings are placed on the inside (cement side) of the cover.

From the foregoing it can be seen by a particular choice of materials and layer thicknesses there has been provided a thin film interference coating which has a high reflectance in the ultraviolet portion of the spectrum (between 250 nanometers and 350 nanometers) which does not suffer from angle limitations. More particularly, the coating of the present invention consists of a stack of layers which has a high reflection band placed such that the sunlight strikes them first. Beneath these stacked layers there has been included additional layers which include a material which has an absorption band that starts at 350 nanometers and which extends beyond 250 nanometers.

It should be appreciated that although in connection with the present invention the disclosure has been directed primarily to the use of the invention in the ultraviolet region, the same principles can be utilized for other wavelength regions by the utilization of different combinations of materials.

We claim:

1. In a solar cell construction, a body formed essentially of silicon having a surface with a photovoltaic junction applied thereon, an anti-reflection coating formed on said surface, a transparent protective cover, a reflective cut-on filter carried by the cover and a layer of substantially transparent cement securing said protective cover to said body so that it overlies the junction and the anti-reflection coating, the reflective cut-on filter comprising a stack of layers formed alternately of higher and lower refractive index materials for reflecting a substantial portion of the light energy in the ultraviolet region below a predetermined cut-on wavelength, the cut-on filter also comprising a layer formed of an absorbing material which has an absorption band commencing at approximately the cut-on wavelength for blocking the passage of solar energy in the ultraviolet region below approximately the cut-on wavelength, said cut-on filter having a transmission cut-on which is angle insensitive to the angle of incidence of solar energy at the cut-on wavelength, said cut-on filter providing angle insensitivity without substantial sacrifice of the capability of reflecting solar energy below the cut-on wavelength at normal incidence.

2. A solar cell construction as in claim 1 wherein said stack of layers is formed of a plurality of periods in which each of the periods is formed of a layer of tantalum pentoxide and a layer of fused silica.

3. A solar cell construction as in claim 1 wherein said stack of layers is formed of a plurality of periods with each of the periods being formed of a layer of zirconium dioxide and a layer of fused silica.

4. A solar cell construction as in claim 1 wherein said absorbing material is titanium oxide.

5. A solar cell construction as in claim 1 wherein the cut-on filter is carried by the side of the cover facing the body of silicon, together with an anti-reflection coating carried on the surface of the cover remote from the body.

6. A solar cell construction as in claim 1 wherein said stack is constructed in such a manner that the layers which first interact with the incident light are essentially non-absorbing for wavelengths in the region of approximately 250 nanometers to 1200 nanometers and so that at least one of the layers which is farther removed from the incident medium than the layers which first interact with the incident light is capable of absorbing at wavelengths in the range of approximately 350 to 250 nanometers whereby energy in the range of approximately 350 to 250 nanometers which is not reflected by the preceding layers in the stack is absorbed.

7. A solar cell construction as in claim 6 wherein the non-absorbing layers are comprised of tantalum pentoxide and silicon dioxide and wherein the absorbing layer is formed of titanium dioxide.

8. A solar cell construction as in claim 1 wherein the higher index material is selected from the group of tantalum pentoxide, zirconium oxide and hafnium oxide and has an index of refraction ranging from approximately 2.0 to 2.4, wherein the lower index material is selected from silicon dioxide, silicon sesquioxide, magnesium fluoride and sapphire and has an index of refraction ranging from approximately 1.4 to 1.7 and wherein the absorbing material is selected from titanium dioxide, cerium oxide and zinc sulfide.

9. In a reflective cut-on filter for use with a body having a surface for receiving incident light, an anti-reflection coating formed on the surface and a layer of substantially transparent cement for securing the reflective cut-on filter to the body, the reflective cut-on filter comprising a transparent support substrate, a stack of layers carried by the substrate, said layers being substantially non-absorbing in wavelengths between 250 nanometers and 1200 nanometers and being formed alternately of higher and lower index materials with the higher index materials having indices of refraction ranging from approximately 2.0 to 2.4 and the lower index materials having indices of refraction ranging from approximately 1.4 to 1.7, said layers being approximately one quarter wave optically thick, at least one of the layers of the stack which is most remote from the layer of the stack which first encounters the incident light being formed of a material having a high index of refraction which is different from the other higher index material utilized in the stack and which is capable of absorbing light energy which is not reflected by the other layers of the stack.

10. A cut-on filter as in claim 9 wherein the light energy absorbed is in the region between approximately 250 and 350 nanometers.

11. A cut-on filter as in claim 9 which is usable for both normally incident and non-normally incident light energy.

12. In a reflective cut-on filter for use in covering a solar cell of the type which includes a body formed essentially of silicon having a surface with a photovoltaic junction applied thereon, an anti-reflection coating formed on the surface and a layer of substantially transparent cement for securing the filter to the body, the reflective cut-on filter comprising a substantially transparent cover, a stack of layers carried by the cover with alternate layers being formed of a first material having a higher index of refraction ranging from approximately 2.0 to 2.4 and the other layers being formed of a second material having a lower index of refraction ranging from approximately 1.4 to 1.7 for reflecting solar energy in the ultraviolet region of approximately 350 nanometers to 250 nanometers, the cut-on filter also comprising at least one layer of a material having an absorption band commencing at approximately 350 nanometers which extends beyond 250 nanometers.

13. A filter as in claim 12 wherein said high index material is tantalum pentoxide and wherein said low index material is fused silica.

14. A filter as in claim 12 wherein said high index material is zirconium dioxide and wherein said low index material is fused silica.

15. A filter as in claim 12 wherein said material having an absorption band commencing at approximately 350 nanometers and which extends beyond 250 nanometers is titanium oxide.

16. A filter as in claim 12 wherein said cover is glass which absorbs ultraviolet energy and wherein said filter is carried by the side of the glass remote from the body.

17. A filter as in claim 12 wherein said cover is fused silica and wherein said stack is carried on the surface of the cover closest to the body.

18. A filter as in claim 12 which is essentially non-absorbing for light energy at normal incidence in wavelengths ranging from approximately 1200 nanometers to 250 nanometers.

* * * * *